United States Patent
Banba et al.

Patent Number: 5,876,841
Date of Patent: Mar. 2, 1999

[54] CONDUCTIVE PASTE AND CONDUCTOR AND CERAMIC SUBSTRATE COMPRISING THE SAME

[75] Inventors: Shinichiro Banba, Komatsu; Tetsuya Ikeda, Moriyama; Hiroji Tani, Nagaokakyo, all of Japan

[73] Assignee: Murata Manufacturing Co., Ltd., Kyoto, Japan

[21] Appl. No.: 769,410

[22] Filed: Dec. 19, 1996

[30] Foreign Application Priority Data

Dec. 27, 1995 [JP] Japan ..................... 7-341308

[51] Int. Cl.⁶ ..................... B32B 17/00
[52] U.S. Cl. ................. 428/208; 428/209; 428/210; 428/432; 428/433; 428/469; 428/901; 174/256; 174/257; 252/513; 501/19; 501/20
[58] Field of Search ............. 428/208, 209, 428/210, 432, 433, 469, 901; 174/256, 257; 252/513; 501/19, 20

Primary Examiner—Timothy M. Speer
Attorney, Agent, or Firm—Ostrolenk, Faber, Gerb & Soffen, LLP

[57] ABSTRACT

The present invention provides a conductive paste and a conductor and a ceramic substrate using the conductive paste which, when used as a conductive material for a ceramic substrate, can prevent cutting of the conductor in a through hole and peeling of the conductor from the through hole side wall during burning, thereby improving the yield and reliability of through hole conduction. The conductive paste contains Cu powder, Ni powder, glass frit and an organic vehicle, the amount of the Ni powder being about 1 to 20% by weight relative to the total amount of the Cu powder and the Ni powder, and the amount of the glass frit being about 1 to 40% by weight relative to the total amount of the Cu powder, the Ni powder and the glass frit.

20 Claims, 2 Drawing Sheets

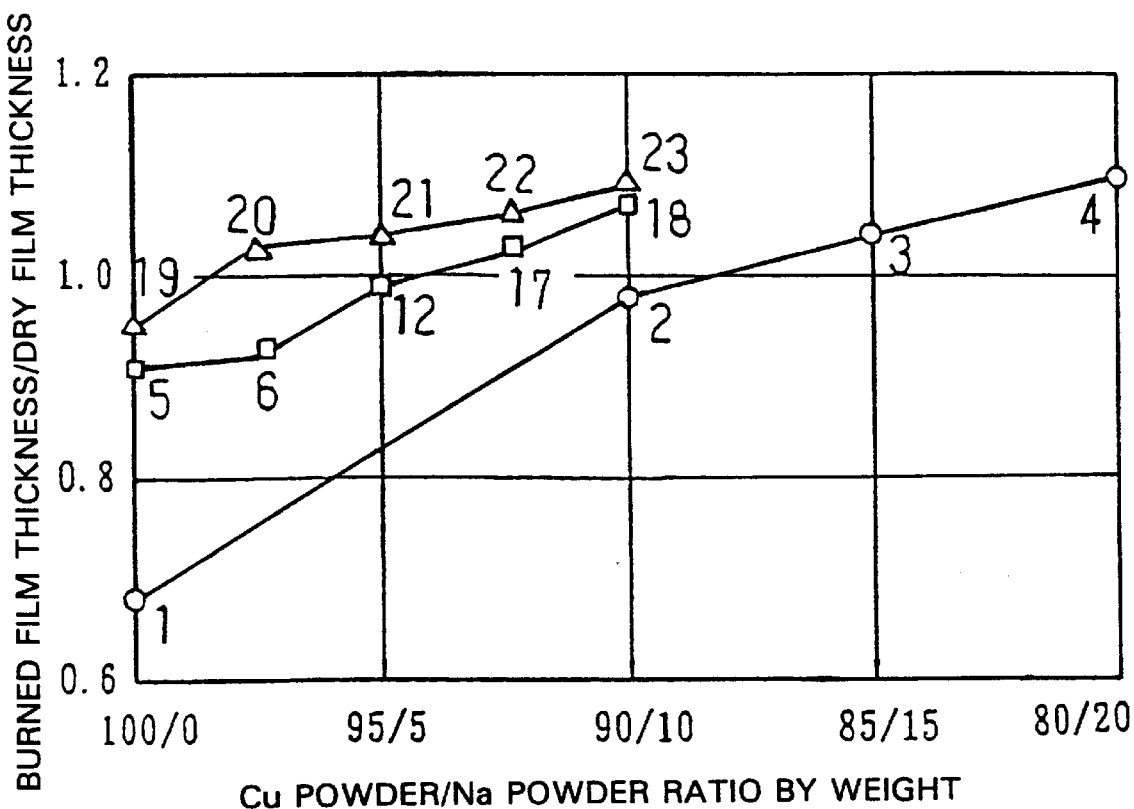

CONDUCTIVE PASTE AND CONDUCTOR AND CERAMIC SUBSTRATE COMPRISING THE SAME

BACKGROUND OF THE INVENTION

1. Field of the Invention

The present invention relates to conductive paste useful to make a conductive material for a ceramic substrate, and particularly as a conductive material for through hole conduction, and a conductor and a ceramic substrate comprising the conductive paste.

2. Description of the Related Art

In a conventional system for forming through hole conduction in a ceramic substrate, as shown in a sectional view of FIG. 1A, a conductive paste 1 comprising Ag/Pd, Ag/Pt or the like is coated by a screen printing method in a through hole 2 having a diameter of 0.3 to 0.5 mm and formed by a mold or laser, and then burned to form a conductor thick film 3 on the side wall of the through hole 2.

Miniaturization of electronic parts and an increase in the density thereof have recently been demanded, resulting in systema in which the diameter of the through hole is decreased to about 0.1 mm, and the through hole is filled with conductive paste, as shown in a sectional view of FIG. 1B.

Electrodes formed on the surface of the ceramic substrate are mainly Cu electrodes having a low resistance value, and excellent reliability such as the resistance to migration. The Cu electrode is formed by burning in a reducing atmosphere.

When the Cu electrode is used as an electrode on the surface of the ceramic substrate, and when Ag/Pd or Ag/Pt is used as a conductor in the through hole, there is a problem in that the conductor in the through hole and the electrode formed on the surface of the ceramic substrate cannot be burned simultaneously, thereby decreasing the yield per unit of time of usable product. Therefore, the demand for using a Cu electrode as the conductor in the through hole has increased.

However, when the through hole having a diameter of about 0.1 mm is filled with Cu paste and burned, there is a problem in that the conductor in the through hole is cut (see FIG. 2A) due to shrinkage or the conductor peels off (see FIG. 2B) the side wall of the through hole, during burning of the paste, thereby lessening the yield and reliability of through hole conduction.

SUMMARY OF THE INVENTION

Accordingly, an object of the present invention is to provide conductive paste, and a conductor and a ceramic substrate comprising the conductive paste which is capable of preventing the conductor in a through hole from being cut and the conductor from peeling off the side wall of the through hole when used as a conductive material for a ceramic substrate, thereby improving the yield and the reliability of through hole conduction.

In order to achieve the object of the present invention, there is provided in accordance with one aspect of the present invention a conductive paste comprising Cu powder, Ni powder, glass frit and an organic vehicle, wherein the amount of the Ni powder is about 1 to 20% by weight relative to the total amount of the Cu powder and the Ni powder, and the amount of the glass frit is about 1 to 40% by weight relative to the total amount of the Cu powder, the Ni powder and the glass frit. The glass frit contained in the conductive paste is a borosilicate and preferably of the $PbO\text{-}SiO_2\text{-}B_2O_3\text{-}ZnO$ type. The conductive paste is used for forming through hole conduction in a ceramic substrate.

In order to achieve the object of the present invention, there is provided a conductor comprising a mixed burned product comprising Cu, Ni and glass in accordance with another aspect of the present invention, wherein the amount of the Ni powder used is about 1 to 20% by weight relative to the total amount of the Cu powder and the Ni powder, and the amount of the glass frit used is about 1 to 40% by weight relative to the total amount of the Cu powder, the Ni powder and the glass frit. The glass frit is a borosilicate and preferably of the $PbO\text{-}SiO_2\text{-}B_2O_3\text{-}ZnO$ type.

In order to achieve the object of the present invention, there is provided in accordance with a further aspect of the present invention a ceramic substrate comprising a conductor used for a conductor circuit and comprising a mixed burning product of Cu, Ni and glass, wherein the amount of the Ni powder used is about 1 to 20% by weight relative to the total amount of the Cu powder and the Ni powder, and the amount of the glass frit used is about 1 to 40% by weight relative to the total amount of the Cu powder, the Ni powder and the glass frit. The glass frit contained in the conductor is a borosilicate and preferably of the $PbO\text{-}SiO_2\text{-}B_2O_3\text{-}ZnO$ type. The conductor is used in a through hole of the conductor circuit.

BRIEF DESCRIPTION OF THE DRAWINGS

FIG. 3 is a graph showing the relation between the Cu powder/Ni powder ratio by weight and the burned film thickness/dry film thickness ratio.

DESCRIPTION OF PREFERRED EMBODIMENTS OF THE INVENTION

Figure 1A:
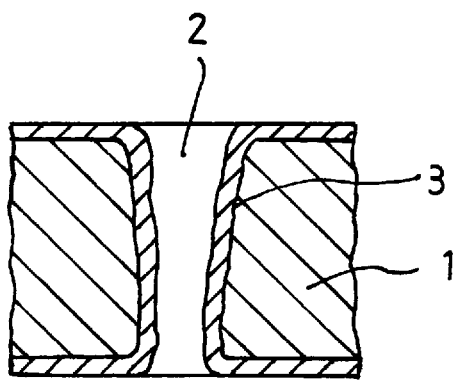
FIG. 1A is a first sectional view showing a through hole conductive portion of a ceramic.
Figure 1B:
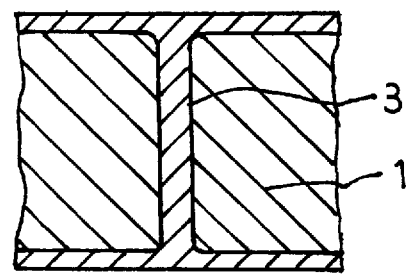
FIG. 1B is a second sectional view showing a through hole conductive portion of a ceramic.
Figure 2A:
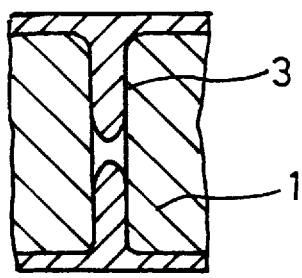
FIG. 2A is a first schematic sectional view showing a defect in a through hole conductive portion of a ceramic substrate.
Figure 2B:
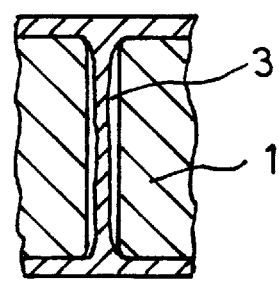
FIG. 2B is a second schematic sectional view showing a defect in a through hole conductive portion of a ceramic substrate.

The conductive paste, and a conductor and a ceramic substrate each of which used the conductive paste during formation are described with reference to embodiments of the present invention.

Embodiment 1

Cu powders respectively having average particle sizes of 1, 3 and 5 $\mu$m, and Ni powder having an average particle size of 3 $\mu$m were prepared as materials for conductive paste. $Pb_3O_4$, $SiO_2$, $H_3BO_3$ and ZnO were mixed, and melted at a high temperature and then vitrified by quenching. The resulting glass was then ground to obtain glass frit having the composition PbO—$SiO_2$—$B_2O_3$—ZnO.

These Cu and Ni powders were then mixed with the glass frit at each of the ratios shown in Table 1, and 30% by weight of an organic vehicle was added to and kneaded with the resulting mixture to prepare the conductive paste. In Table 1, the amount of each of the Cu powder and Ni powder is shown in % by weight relative to the total amount of the Cu powder and the Ni powder, and the amount of the glass frit is shown in % by weight relative to the total amount of the Cu powder, the Ni powder and the glass frit. The organic vehicle was obtained by dissolving an acrylic resin in α-terpineol.

The resulting conductive paste was then coated on an alumina substrate previously prepared as a ceramic substrate and having a thickness of 0.63 mm and a through hole having a diameter of 0.1 mm. Namely, the conductive paste was coated in a form of 2 mm×2 mm by a screen printing method to form a conductive paste layer for measuring the degree of burning shrinkage and adhesive strength to the alumina substrate. The through hole was also filled with the conductive paste. The substrate was then burned in an $N_2$ atmosphere at a temperature of 580° C. for 10 minutes to form a 2 mm square electrode and a through hole conductor in the alumina substrate. In the formation of the electrode, the film thickness was measured after coating and drying and after burning, to determine the degree of burning shrinkage as a ratio of burned film thickness/dry film thickness.

A lead wire was then soldered perpendicularly to the 2 mm square electrode, and pulled perpendicularly to the electrode at a constant speed to determine the adhesive strength of the electrode to the alumina substrate. The resistance of the through hole conductive portion was also measured. The results obtained are shown in Table 1. In Table 1, samples with the mark * are out of the range of the present invention. FIG. 3 shows the relations between the burned film thickness/dry film thickness ratio and the Cu powder/Ni powder ratio by weight with the average particle size of the Cu powder as a parameter with the amount of the glass frit kept constant at 10% by weight on the basis of the results shown in Table 1. In the figure, the numerals each indicate the sample No. shown in Table 1.

the preferable amount of the Ni powder relative to the total amount of the Cu powder and the Ni powder depends upon the average particle size of the Cu powder, the amount of the Ni powder is preferably within the range of about 1 to 20% by weight, more preferably about 2.5 to 15% by weight.

A conductive paste without the glass frit has very low adhesive strength and is thus undesirable, as shown by Sample No. 7. If the amount of the glass frit to the total amount of the Cu powder, the Ni powder and the glass frit exceeds about 40% by weight, the conduction resistance is undesirably increased, as shown by Sample No. 16. The amount of the glass frit to the total amount of the Cu powder, the Ni powder and the glass frit is preferably within the range of about 1 to 40% by weight, more preferably about 3 to 30% by weight.

Embodiment 2

After Cu powder, Ni powder and glass frit were prepared by the same method as Embodiment 1, conductive pastes having the composition ratios shown in Table 2 was prepared.

A through hole having a diameter of 0.1 mm of an alumina substrate previously prepared was then filled with the conductive paste. Thereafter, the alumina substrate was burned in an $N_2$ atmosphere at a temperature of 580° C. for 10 minutes to form a through hole conductor in the alumina substrate.

TABLE 1

| Sample No. | Average Particle Size of Cu Powder (μm) | Amount of Cu Powder/Ni Powder (Cu wt %/Ni wt %) | Amount of Glass Frit (wt %) | Film Thickness Dry Film Thickness (1) (μm) | Film Thickness Burned Film Thickness (2) (μm) | (2)/(1) | Adhesive Strength (kgf) | Conduction Ressitance (Ω) |
|---|---|---|---|---|---|---|---|---|
| *1 | 1 | 100/0 | 10 | 21.5 | 14.7 | 0.68 | — | — |
| 2 | 1 | 90/10 | 10 | 38.7 | 37.8 | 0.98 | — | — |
| 3 | 1 | 85/15 | 10 | 27.1 | 28.1 | 1.04 | — | — |
| 4 | 1 | 80/20 | 10 | 29.2 | 32.2 | 1.10 | — | — |
| *5 | 3 | 100/0 | 10 | 22.5 | 20.4 | 0.91 | — | — |
| 6 | 3 | 97.5/2.5 | 10 | 21.5 | 19.8 | 0.92 | — | — |
| *7 | 3 | 95/5 | 0 | — | — | — | 0 | 0.1 |
| 8 | 3 | 95/5 | 1 | — | — | — | 0.2 | 0.15 |
| 9 | 3 | 95/5 | 3 | — | — | — | 1.3 | 0.2 |
| 10 | 3 | 95/5 | 5 | — | — | — | 20 | 0.3 |
| 11 | 3 | 95/5 | 7 | — | — | — | 2.3 | 0.4 |
| 12 | 3 | 95/5 | 10 | 18.1 | 17.9 | 0.99 | 2.5 | 0.5 |
| 13 | 3 | 95/5 | 20 | — | — | — | 2.7 | 1.5 |
| 14 | 3 | 95/5 | 30 | — | — | — | 2.5 | 5.0 |
| 15 | 3 | 95/5 | 40 | — | — | — | 2.0 | 10.0 |
| *16 | 3 | 95/5 | 50 | — | — | — | 1.5 | 15.0 |
| 17 | 3 | 92.5/7.5 | 10 | 18.5 | 18.8 | 1.02 | — | — |
| 18 | 3 | 90/10 | 10 | 24.0 | 25.6 | 1.07 | — | — |
| *19 | 5 | 100/0 | 10 | 22.4 | 21.2 | 0.95 | — | — |
| 20 | 5 | 97.5/2.5 | 10 | 20.8 | 21.5 | 1.03 | — | — |
| 21 | 5 | 95/5 | 10 | 20.2 | 21.1 | 1.04 | — | — |
| 22 | 5 | 92.5/7.5 | 10 | 19.1 | 20.2 | 1.06 | — | — |
| 23 | 5 | 90/10 | 10 | 22.9 | 24.9 | 1.09 | — | — |

The mark "—" means unmeasured.

As shown in Table 1 and FIG. 3, the conductive paste of the present invention comprising Cu powder, Ni powder, glass frit and an organic vehicle exhibits a low degree of burning shrinkage, high adhesive strength to the ceramic substrate and low conduction resistance.

On the other hand, a conductive paste without Ni powder exhibits a higher degree of burning shrinkage and is thus undesirable, as shown by Sample Nos. 1, 5 and 19. Although In the thus-obtained through hole conductor, the resistance between the both ends of the through hole was measured to examine the presence of conduction, and the through hole was cut in the direction of the through hole to examine the presence of peeling of the conductor from the through hole side wall. These characteristics were examined on 192 through holes for each sample. The results obtained are shown in Table 2. In Table 2, samples with the mark * are out of the range of the present invention.

TABLE 2

| Sample No. | Average particle size of Cu Powder (μm) | Amount of Cu powder/ Ni powder (Cu/Ni ratio by weight) | Amount of glass frit (wt %) | Yield (%) | Peeling of conductor from side wall |
|---|---|---|---|---|---|
| *31 | 1 | 100/0 | 10 | 42 | present |
| 32 | 1 | 88/12 | 10 | 100 | absent |
| *33 | 1 | 88/12 | 0 | 90 | present |
| *34 | 3 | 100/0 | 10 | 100 | present |
| 35 | 3 | 94/6 | 10 | 100 | absent |
| *36 | 3 | 94/6 | 0 | 90 | present |

As shown in Table 2, the use of the conductive paste of the present invention permits the formation of a through hole conductor having excellent conduction yield and no peeling of the conductor from the through hole side wall.

Although in the above embodiments, the alumina substrate was used as the ceramic substrate in which the through hole conduction was formed, the present invention is not limited to this. Namely, even when various ceramic substrates such as an insulator ceramic substrate, a non-conducting dielectric ceramic substrate, etc. are used, the same effects as described above can be obtained.

As the glass frit, lead zinc borosilicate type, bismuth borosilicate type, barium borosilicate type glass frit can appropriately used.

As the organic vehicle, high-boiling-point solvent solutions of ethyl cellulose resin and alkyd resin other than the α-terpineol solution of acrylic resin can also be appropriately used.

The average particle size of the Cu powder and Ni powder contained in the conductive paste is preferably within the range of about 0.3 to 10 μm. Namely, the average particle size is preferably about 0.3 μm or more in order to prevent an increase in thixotropy of the conductive paste and the consequent decrease in fluidity, and ensure the properties of filling the through hole with the conductive paste. The average particle size is preferably about 10 μm or less in order to ensure micro-dispersion of conductive components in the conductive paste and produce uniform sintering reaction. The average particle size of the Cu powder and Ni powder contained in the conductive paste is most preferably within the range of about 1 to 5 μm.

The above description reveals that when the conductive paste of the present invention is baked to a ceramic substrate, the Ni powder contained therein suppresses the degree of burning shrinkage, and the glass frit contained therein improves the adhesive strength to the ceramic substrate. Therefore, when the conductive paste of the present invention is used as a conductor for the ceramic substrate, particularly, as a through hole conductive material, it is possible to prevent cutting of the conductor in the through hole and peeling of the conductive from the through hole side wall during burning of the conductive paste, thereby obtaining the ceramic substrate having improved conduction yield and conduction reliability.

What is claimed is:

1. A conductive paste comprising Cu powder, Ni powder, glass frit and an organic vehicle, wherein the amount of the Ni powder is about 1 to 20% by weight relative to the total amount of the Cu powder and the Ni powder, and the amount of the glass frit is about 1 to 40% by weight relative to the total amount of the Cu powder, the Ni powder and the glass frit.

2. A conductive paste according to claim 1, wherein the glass frit is a borosilicate.

3. A conductive paste according to claim 2, wherein the glass frit is $PbO$—$SiO_2$—$B_2O_3$—$ZnO$.

4. A conductive paste according to claim 1, wherein the amount of the Ni powder is about 2.5 to 15% by weight relative to the total amount of the Cu powder and the Ni powder, and the amount of the glass frit is about 3 to 30% by weight relative to the total amount of the Cu powder, the Ni powder and the glass frit.

5. A conductive paste according to claim 1, wherein the average particle size of the Cu powder and Ni powder contained in the conductive paste is within the range of about 0.3 to 10 μm.

6. A conductive paste according to claim 5, wherein the average particle size of the Cu powder and Ni powder contained in the conductive paste is within the range of about 1 to 5 μm.

7. A conductor comprising a burned product comprising Cu, Ni and glass, wherein the amount of a Ni powder is about 1 to 20% by weight relative to the total amount of a Cu powder and the Ni powder, and the amount of glass frit is about 1 to 40% by weight relative to the total amount of the Cu powder, the Ni powder and the glass frit.

8. A conductor according to claim 7, wherein the glass frit is a borosilicate.

9. A conductor according to claim 8, wherein the glass frit is $PbO$—$SiO_2$—$B_2O_3$—$ZnO$.

10. A conductor according to claim 8, wherein the amount of the Ni powder is about 2.5 to 15% by weight relative to the total amount of the Cu powder and the Ni powder, and the amount of the glass frit is about 3 to 30% by weight relative to the total amount of the Cu powder, the Ni powder and the glass frit.

11. A conductor according to claim 10, wherein the average particle size of the Cu powder and Ni powder contained in the conductive paste is within the range of about 0.3 to 10 μm.

12. A conductor according to claim 11, wherein the average particle size of the Cu powder and Ni powder contained in the conductive paste is within the range of about 1 to 5 μm.

13. A ceramic substrate having a conductor circuit thereon, wherein said conductor comprises a burned product composed of Cu, Ni and glass, wherein the amount of the Ni powder is about 1 to 20% by weight relative to the total amount of the Cu powder and the Ni powder, and the amount of the glass frit is about 1 to 40% by weight relative to the total amount of the Cu powder, the Ni powder and the glass frit.

14. A ceramic substrate according to claim 13, wherein the glass frit is a borosilicate.

15. A ceramic substrate according to claim 14, wherein the glass frit is $PbO$—$SiO_2$—$B_2O_3$—$ZnO$.

16. A ceramic substrate according to claim 14, wherein the amount of the Ni powder is about 2.5 to 15% by weight relative to the total amount of the Cu powder and the Ni powder, and the amount of the glass frit is about 3 to 30% by weight relative to the total amount of the Cu powder, the Ni powder and the glass frit.

17. A ceramic substrate according to claim 16, wherein the average particle size of the Cu powder and Ni powder contained in the conductive paste is within the range of about 0.3 to 10 μm.

18. A ceramic substrate according to claim 17, wherein the average particle size of the Cu powder and Ni powder contained in the conductive paste is within the range of about 1 to 5 μm.

19. A ceramic substrate according to claim 18, wherein said substrate has at least one through hole therethrough and said conductor extends through said through hole.

20. A ceramic substrate according to claim 13, wherein said substrate has at least one through hole therethrough and said conductor extends through said through hole.

* * * * *